United States Patent

Kaja et al.

[11] Patent Number: 5,483,105
[45] Date of Patent: Jan. 9, 1996

[54] MODULE INPUT-OUTPUT PAD HAVING STEPPED SET-BACK

[75] Inventors: Suryanarayana Kaja, Hopewell Junction; Eric D. Perfecto, Poughkeepsie; William H. Price, Cortlandt Manor; Sampath Purushothaman, Yorktown Heights; Srinivasa N. Reddy, LaGrangeville, all of N.Y.; Vivek M. Sura, Pune, Ind.; George E. White, Fishkill, N.Y.

[73] Assignee: International Business Machines Corporation, Armonk, N.Y.

[21] Appl. No.: 233,025

[22] Filed: Apr. 25, 1994

[51] Int. Cl.$^6$ .......................... H01L 23/48; H01L 23/52; H01L 29/40
[52] U.S. Cl. .......................... 257/779; 257/781; 257/751
[58] Field of Search .................. 257/772, 779, 257/780, 781, 766, 767, 751

[56] References Cited

U.S. PATENT DOCUMENTS

| | | | |
|---|---|---|---|
| 4,672,739 | 6/1987 | Churchwell et al. | 29/589 |
| 4,835,593 | 5/1989 | Arnold et al. | |
| 4,970,570 | 11/1990 | Agarwala et al. | 257/780 |
| 5,036,383 | 7/1991 | Mori | 257/781 |
| 5,060,051 | 10/1991 | Usuda | 257/781 |
| 5,175,609 | 12/1992 | DiGiacomo et al. | 257/781 |
| 5,367,195 | 11/1994 | DiGiacomo et al. | 257/781 |

FOREIGN PATENT DOCUMENTS 61-292947  12/1986  Japan ........................ 257/781

OTHER PUBLICATIONS

IBM Technical Disclosure Bulletin, R. W. Noth, "Solder Bond", vol. 17, No. 8, Jan. 1975, p. 2214.
IBM Research Disclosure, Palmateer, et al., "Improving Pin Pull Strength", Apr. 1987, No. 276.

*Primary Examiner*—Sara W. Crane
*Assistant Examiner*—S. V. Clark
*Attorney, Agent, or Firm*—Ira D. Blecker

[57] ABSTRACT

A ceramic substrate pad used for establishing brazed connection between a pin and the substrate in the packaging of microelectronic semiconductor circuit chip. The pad is characterized by a stepped setback in the upper surface thereof which setback is oxidized to prevent wetting by the brazing alloy which bonds the pin to the pad. Stresses attributable to the brazing are isolated from the setback area and thus have reduced effect in causing cracking at the edges of the pad-substrate interface.

9 Claims, 1 Drawing Sheet

MODULE INPUT-OUTPUT PAD HAVING STEPPED SET-BACK

BACKGROUND OF THE INVENTION

The present invention generally relates to microelectronic device packages and, more specifically, to establishing pin connections to ceramic substrate pads used in such packaging. Glass ceramic substrates commonly used in the packaging of microelectronic semiconductor circuit chips have comparatively low strength and fracture toughness. Multilayered thin film structures (pads) are formed upon such glass ceramic substrates to provide electrical interconnections between circuit points, contained within the substrate, and input-output pins from the next level of packaging as well as circuit points from semiconductor circuit chips mounted upon the substrates. The pins are brazed to the pads. This typical structural arrangement is shown in U.S. Pat. No. 4,835,593, issued on May 30, 1989, to Anthony F. Arnold, et al., and assigned to the present assignee.

Due to the inherent fragile nature of the glass ceramic material of the substrate, there is the problem of glass ceramic cracking, particularly caused by stresses induced by the brazing of the aforementioned pins to the substrate pads. One known technique for reducing such cracking is taught in U.S. Pat. No. 4,672,739, issued Jun. 16, 1987 to Robert W. Churchwell, et al., and assigned to the present assignee. In accordance with the '739 patent, stress originates partly from the brazed joint between pad and pin which stress is directed to the underlying ceramic substrate. The stress is greatest around the edges of the pad. When the stress reaches a sufficient level, the ceramic beneath the pad fractures, causing the pin and the pad to be mechanically separated from the substrate. In order to reduce stress around the pad edges, the '739 patent provides a dielectric layer dam which covers the perimeter of each pad to prevent the brazing liquid from coming into contact with that perimeter by confining the brazing liquid to the central region of the pad surrounding the pin. The '739 patent also notes a prior art stress reduction technique whereby each entire pad surface area is divided into a number of smaller wettable surface areas, each smaller area having a surrounding non-wettable region, the brazing alloy adhering only to each surrounded wettable area. However, the total effective cross-sectional area occupied by all the smaller brazed points is significantly less than that of the entire pad. Thus, the strength and the electrical resistance of the bond between total pad and substrate are adversely affected. The latter technique also is described in connection with a solder bond in R. W. Noth, "Solder Bond", IBM Technical Disclosure Bulletin, Vol. 17, No. 8, Jan. 1975, page 2214.

SUMMARY OF THE INVENTION

One object of the present invention is to provide means for reducing stress in a pin to pad brazed connection while maintaining a maximized effective cross-sectional area of the brazed joint.

Another object of the invention is to provide a brazed pin-to-pad connection characterized by low stress, high strength and high electrical conductivity.

A further object is to provide a limited non-wetted area about the perimeter of a brazed pad without the use of a dielectric layer braze dam.

These and other objects of the present invention, as will appear from a reading of the following specification, are achieved, in a best mode embodiment, by the provision of a stepped setback in the upper surface of a ceramic substrate pad. The rim area of the setback is composed of an oxidizable material while the raised central area surrounded by the rim area is composed of a non-oxidizable area. Only the non-oxidizable area is wetted by the brazing alloy for affixing a pin to the pad.

The pad comprises a bonding layer (e.g., chromium) interfacing with the ceramic substrate, a plastic layer (e.g. gold) a braze barrier layer (e.g. nickel), and a gold layer in vertical succession. The gold layer is recessed so as to form a rim area exposing an oxidizable portion of the nickel layer. The exposed portion of the nickel is oxidized by thermal cycling to present a non-wettable surface to the pin brazing alloy. The unexposed portion of the nickel, covered by the gold layer, may also be oxidized by thermal cycling without deleterious effects while improving the braze barrier quality of the nickel within the pad.

BEST MODE FOR CARRYING OUT THE INVENTION

Figure 1:
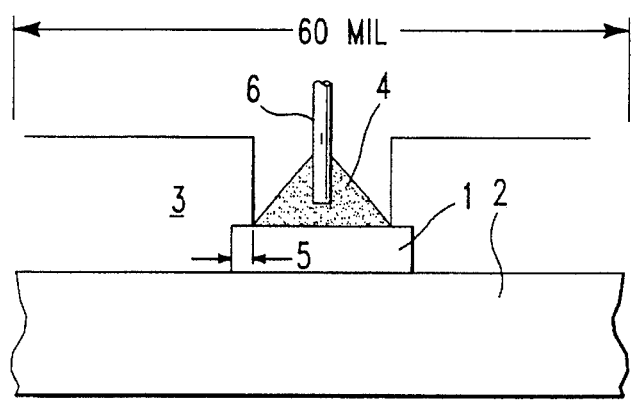
FIG. 1 is a simplified cross-sectional view of a prior art pin-to-pad brazed connection utilizing a dielectric layer braze dam.

Referring first to prior art FIG. 1, the upper surface of pad 1 on ceramic substrate 2 is surrounded by a dam 3 of dielectric material which prevents brazing alloy 4 from coming into contact with the peripheral area 5 of the upper surface of pad 1. Thus, pin 6 is brazed only to the central region of pad 1 which is uncovered by dam 3 whereby tensile stress is reduced at the pin-to-pad interface as taught in the aforementioned U.S. Pat. No. 4,672,739.

Figure 2:
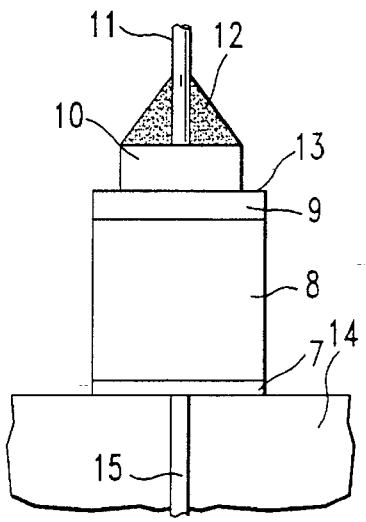
FIG. 2 is a simplified cross-sectional view of the pin-to-pad brazed connection of the present invention.

The present invention is a pin-to-pad brazed connection without resort to a dielectric layer braze dam. Referring now to FIG. 2, this is accomplished by forming a composite multilayered pad comprising bonding layer 7, plastic layer 8, braze barrier layer 9 and bonding step 10 which is set back from the edge of braze barrier 9. Pin 11 is bonded to step 10 by bonding alloy 12 which wets only step 10 but not the exposed edge 13 of the braze barrier 9 left uncovered by step 10. Edge 13 is oxidized by thermal cycling incident to the deposition of barrier 9. The resulting pad is formed on ceramic substrate 14 having a conducting via 15 therein for establishing contact to bonding layer 7. Conventional processing steps may be employed for forming the structure shown.

Figure 3:
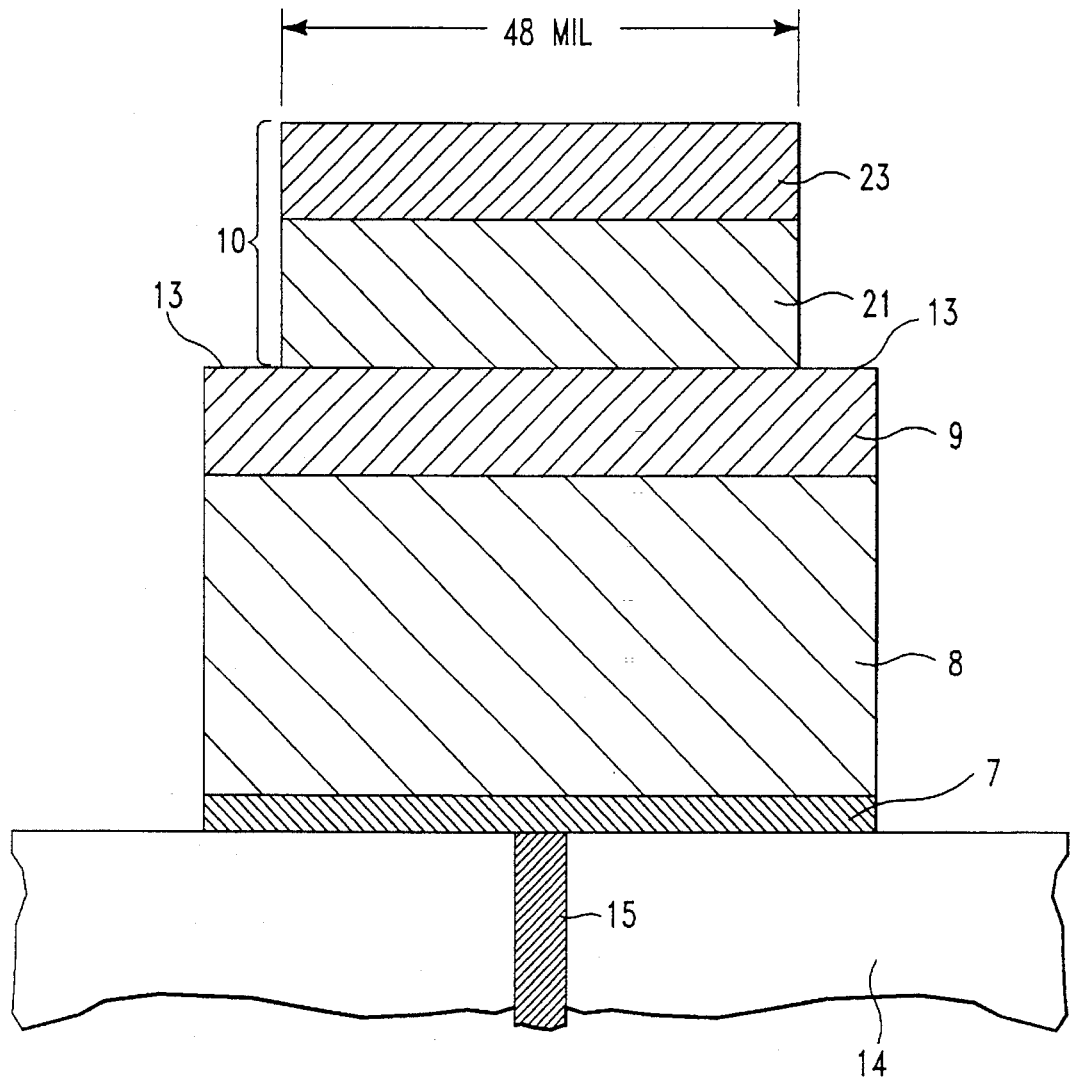
FIG. 3 is a cross-sectional view of the materials comprising the pad of FIG. 2.

The specific materials employed in a best mode of the invention are shown in FIG. 3. A bonding layer 7 of chromium of about 0.02 μm thickness is first deposited on a glass ceramic substrate 14 having conducting via 15 therein. Preferred glass ceramic materials are those disclosed in Kumar, et al., U.S. Pat. No. 4,301,324, the disclosure of which is incorporated by reference herein. A plastic layer of gold 8 of 6–8 μm thickness is formed on the bonding layer 7 to provide a soft metal cushion to reduce stress transmission. To prevent the soft metal gold 8 from reacting with a subsequent gold-tin pin eutectic alloy braze (not shown), reaction barrier layers (i.e., braze barriers) of nickel 9 of about 0.5 μm thickness and nickel 21 of about 1.5 to 2.0 μm are provided. Layer 9 covers the full width of the pad while layer 21 covers only the central area as shown. An edge area 13 is left exposed on the upper surface of layer 9. Finally, a bonding gold layer 23 of about 0.2 to 0.5 μm thickness is placed on layer 21 to complete the pad structure.

In the course of conventional thermal cycling processing steps associated with the formation of the layers including layers 9 and 21, the top surfaces of layers 9 and 21 are thermally oxidized. The resulting oxidized layers prevent the wetting of the exposed edges of layers 9 and 21 by the brazing alloy when the pin (not shown) is bonded to gold layer 23. Thus, stresses are eliminated at the edge 13 of the composite layered pad. The oxidized nickel layers also enhance the effectiveness of the braze barrier between gold 8 and the gold-tin pin eutectic alloy braze without noticeably impacting the bonding of gold layer 23 to nickel layer 21 or the electrical resistance therebetween.

Other relatively soft metals of good electrical conductivity may be substituted for gold layer 19, e.g., aluminum, copper. Other braze barrier layers may be employed, e.g., titanium, copper-titanium and titanium; titanium, titanium oxide (TiO) and titanium.

It should be noted that it is not necessary that the layer 21 be recessed relative to layer 9. It is only required that bonding layer 23 be recessed relative to the braze barrier layer 9.

While the invention has been described in terms of its preferred embodiments, those skilled in the art will realize that the invention can be practiced with modification within the spirit and scope of the appended claims.

Having thus described our invention, what we claim as new and desire to secure by Letters Patent is as follows:

1. In combination,
    a ceramic substrate;
    a brazing alloy;
    a conductive pin; and
    a conductive layered pad for braze bonding said pin to said substrate,
    said pad comprising a first bonding layer bonded to said substrate,
    a cushion layer
    a braze barrier layer; and
    a second bonding layer
    said pin being brazed to said second bonding layer,
    said second bonding layer being a smaller width than said braze barrier layer so as to form a stepped set back,
    said braze barrier layer being oxidized sufficiently to be non-wettable by said brazing alloy.

2. The structure defined in claim 1 wherein said first layer is chromium and said cushion layer comprises gold.

3. The structure defined in claim 1 wherein said cushion layer is aluminum.

4. The structure defined in claim 1 wherein said cushion layer is copper.

5. The structure defined in claim 2 wherein said braze barrier layer comprises nickel.

6. The structure defined in claim 1 wherein said braze barrier layer comprises a composite of titanium, copper-titanium and titanium layers.

7. The structure defined in claim 1 wherein said braze barrier layer comprises a composite of titanium, titanium oxide (TiO) and titanium layers.

8. The structure defined in claim 1 wherein said first layer is chromium, said cushion layer is gold, said braze barrier layer is nickel and said second bonding layer is gold.

9. The structure defined in claim 1 wherein said ceramic is a glass ceramic.

* * * * *